United States Patent [19]
Carlson et al.

[11] Patent Number: 5,316,794
[45] Date of Patent: May 31, 1994

[54] METHOD FOR SERVICING VACUUM CHAMBER USING NON-REACTIVE GAS-FILLED MAINTENANCE ENCLOSURE

[75] Inventors: David K. Carlson, Santa Clara; Norma B. Riley, Pleasanton, both of Calif.

[73] Assignee: Applied Materials, Inc., Santa Clara, Calif.

[21] Appl. No.: 989,248

[22] Filed: Dec. 11, 1992

[51] Int. Cl.⁵ ............................................. C23C 16/00
[52] U.S. Cl. ........................... 427/248.1; 118/DIG. 7; 454/188
[58] Field of Search ...................... 427/248.1; 118/719, 118/DIG. 7; 454/60, 63, 188, 189, 193

[56] References Cited

U.S. PATENT DOCUMENTS 4,901,764 2/1990 Meline ............................ 454/189 X
5,020,475 6/1991 Crabb et al. .......................... 118/719

FOREIGN PATENT DOCUMENTS 0447314 9/1991 European Pat. Off.
3262470 10/1988 Japan.

Primary Examiner—Mark L. Bell
Assistant Examiner—David R. Sample
Attorney, Agent, or Firm—John P. Taylor

[57] ABSTRACT

A process and apparatus is disclosed for providing access to the interior of a vacuum deposition chamber in a vacuum deposition apparatus without exposing residues, such as chlorosilane residues, within the chamber to moisture and/or oxygen-containing gases. The process comprises first placing over the upper surface of the vacuum deposition apparatus an enclosure which has a bottom opening large enough to completely cover the top opening to the chamber, and which is capable of being filled with one or more non-reactive gases. One or more non-reactive gases are then flowed into the enclosure to purge moisture and/or oxygen-containing gases from the enclosure. After the enclosure has been mounted on the apparatus and purged by the flow of non-reactive gases therein, the vacuum deposition chamber may be opened, while continuing the flow of non-reactive gases into the enclosure. After servicing, the vacuum deposition chamber may be resealed, the flow of non-reactive gases shut off, and the enclosure then removed from the apparatus. In a preferred embodiment, the flow of non-reactive gases into the enclosure is positioned to flow down from the top of the enclosure at a right angle to openings in the sidewall of the enclosure provided for accessing the vacuum deposition chamber, to thereby provide a gas curtain of non-reactive gas flow across the openings to inhibit ingress of moisture and/or oxygen-containing gases, as well as particulate impurities, into the enclosure.

9 Claims, 4 Drawing Sheets

```
┌─────────────────────────────────────────────┐
│ PLACING AN ENCLOSURE CAPABLE OF BEING       │
│ FILLED WITH ONE OR MORE NON-REACTIVE        │
│ GASES OVER THE UPPER SURFACE OF A           │
│ VACUUM DEPOSITION APPARATUS HAVING          │
│ THEREIN A VACUUM DEPOSITION CHAMBER         │
│ WITH AN UPPER OPENING COMPLETELY            │
│ COVERED BY THE ENCLOSURE                    │
└─────────────────────────────────────────────┘
                      │
┌─────────────────────────────────────────────┐
│ FLOWING ONE OR MORE NON-REACTIVE GASES      │
│ INTO THE ENCLOSURE TO PURGE THE             │
│ ENCLOSURE OF ANY MOISTURE AND/OR            │
│ OXYGEN-CONTAINING GASES                     │
└─────────────────────────────────────────────┘
                      │
┌─────────────────────────────────────────────┐
│ OPENING THE VACUUM DEPOSITION CHAMBER       │
│ WHILE CONTINUING TO FLOW THE ONE OR MORE    │
│ NON-REACTIVE GASES INTO THE ENCLOSURE       │
└─────────────────────────────────────────────┘
                      │
┌─────────────────────────────────────────────┐
│ CLOSING THE VACUUM DEPOSITION CHAMBER       │
└─────────────────────────────────────────────┘
                      │
┌─────────────────────────────────────────────┐
│ SHUTTING OFF THE FLOW OF NON-REACTIVE       │
│ GASES INTO THE ENCLOSURE                    │
└─────────────────────────────────────────────┘
                      │
┌─────────────────────────────────────────────┐
│ REMOVING THE ENCLOSURE FROM THE             │
│ VACUUM DEPOSITION APPARATUS                 │
└─────────────────────────────────────────────┘
```

FIG. 1

METHOD FOR SERVICING VACUUM CHAMBER USING NON-REACTIVE GAS-FILLED MAINTENANCE ENCLOSURE

BACKGROUND OF THE INVENTION

1. Field of the Invention

This invention relates to a process and apparatus for servicing apparatus used in the processing of semiconductor wafers. More particularly, this invention relates to a process and apparatus which is useful in the cleaning of a reactor chamber used for the deposition of epitaxial silicon on a silicon wafer.

2. Description of the Related Art

In the deposition of an epitaxial layer of silicon on a silicon semiconductor wafer by chemical vapor deposition (CVD) in a vacuum deposition chamber, using chlorosilane gas, various chlorosilane polymer byproducts or residues form in the deposition chamber.

When the deposition chamber is subsequently opened to the atmosphere for servicing, moisture and/or oxygen-containing gases can enter the chamber and react with such chlorosilane polymeric residues to form chlorosiloxane polymers, which can result in the release of significant amounts of corrosive HCl gas and a powdery material which sometimes ignites.

Control, or preferably elimination, of such a reaction of moisture or oxygen with chlorosilane residues accumulated in a vacuum deposition chamber of semiconductor wafer processing apparatus is, therefore, important for safety, reliability, and particle defect reduction.

One previous approach to the solution of this problem has been to use exhaust systems to ventilate the area around the vacuum deposition chamber so that when the chamber was opened and exposed to moisture and/or oxygen-containing gases, the corrosive and inflammable gaseous byproducts, generated during such exposure, could be removed as they were formed.

While such an approach reduced at least some of the deleterious effects of such chlorosiloxane formation, it would be more desirable if the reaction itself of the chlorosilane with moisture and/or oxygen to form chlorosiloxane could be completely suppressed or eliminated.

SUMMARY OF THE INVENTION

The invention comprises a process and apparatus by which the formation of chlorosiloxane from accumulated chlorosilane residues, and the resultant formation of byproducts which may be corrosive and inflammatory, may be completely suppressed or eliminated.

In accordance with the invention, an enclosure is fitted over the deposition chamber and then purged with one or more non-reactive gases, all prior to opening the chamber. The deposition chamber is then opened while this enclosure is in place, and any required maintenance is then carried out in the deposition chamber while continuing to flow such non-reactive gas into the enclosure. Any components which need to be removed from the opened deposition chamber, e.g., a susceptor or showerhead, may be inserted into a sealed vessel, prior to removal of the component from the enclosure, for transportation to a remote facility such as a cleaning facility where any such accumulated chlorosilane residues may then be removed from the component.

The following description and accompanying drawings will serve to further illustrate the invention.

BRIEF DESCRIPTION OF THE DRAWINGS

FIG. 1 is a flow sheet, illustrating the process of the invention.

DETAILED DESCRIPTION OF THE INVENTION

The invention provides a process and apparatus for providing access to the interior of a vacuum deposition chamber without exposing residues within the chamber to moisture and/or oxygen-containing gases by first placing, over the upper portion of an apparatus containing a vacuum deposition chamber, an enclosure capable of being filled with one or more gases. One or more non-reactive gases are then flowed into the enclosure to purge moisture and/or oxygen-containing gases from the enclosure. The vacuum deposition chamber cover may then be removed and the chamber opened, while continuing the flow of non-reactive gas/gases into the enclosure. After completion of the work within the vacuum deposition chamber, including removal of any components therein which may need cleaning or replacement, the vacuum deposition chamber cover is again secured over the chamber to seal the chamber. The flow of nonreactive gases into the enclosure may then be stopped and the enclosure removed from the apparatus.

Figure 2A:
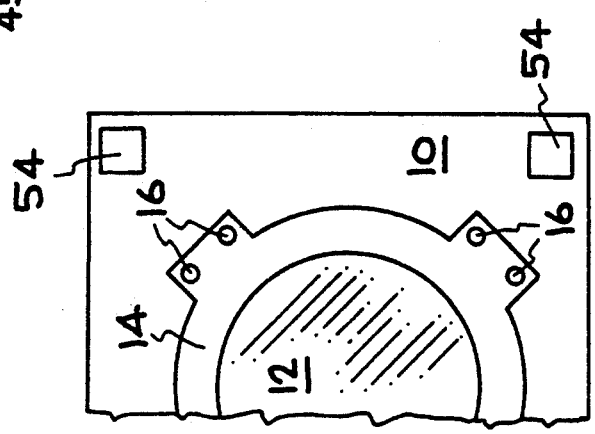
FIG. 2A is a fragmentary top view of a portion of the prior art apparatus of FIG. 2, showing the top plate and underlying quartz window of the vacuum deposition chamber bolted in place prior to opening the chamber.
Figure 2:
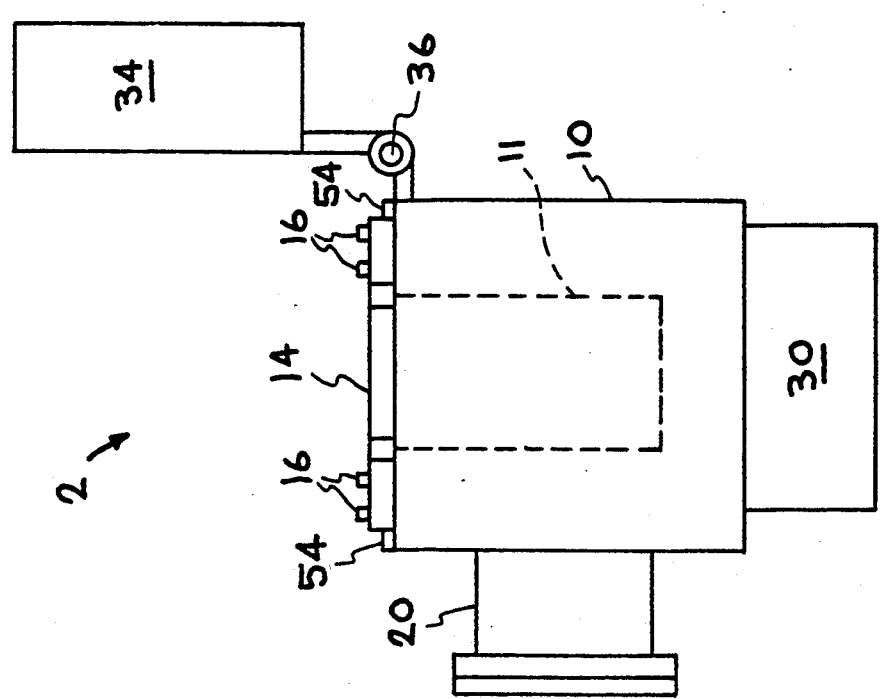
FIG. 2 is a side view of a prior art vacuum deposition apparatus prior to fitting the enclosure of the invention onto the apparatus, and prior to opening the vacuum deposition chamber.

Referring now to the drawings, and in particular to FIG. 2 and 2A, a vacuum deposition apparatus is generally illustrated at 2 which, in the illustrated embodiment, includes a vacuum deposition reactor apparatus 10, an interlock or loadlock 20 through which wafers may be moved in and out of deposition reactor 10 without breaking the vacuum in reactor 10, and heat lamp modules 30 and 34.

The vacuum deposition chamber 11 itself within vacuum deposition reactor apparatus 10 is provided with quartz windows at the top and bottom of vacuum chamber A portion of one of these quartz windows is shown at 12 in FIG. 2A. Upper quartz window 12, and the corresponding quartz window at the bottom of vacuum chamber 11 permit chamber 11 and the contents therein to be radiantly heated via heat lamp modules 30 and 34, which are normally positioned immediately adjacent the windows, as shown by the position of heat lamp module 30 in FIG. 2.

Upper heat lamp module 34 is hinged at 36 to permit the module to be swung out of the way to permit removal of upper quartz window 12 for ingress into vacuum chamber 11. As shown in FIG. 2A, quartz window 12 is secured to vacuum deposition reactor apparatus 10 via a ring 14 which is bolted to apparatus 10 via bolts 16.

Figure 3:
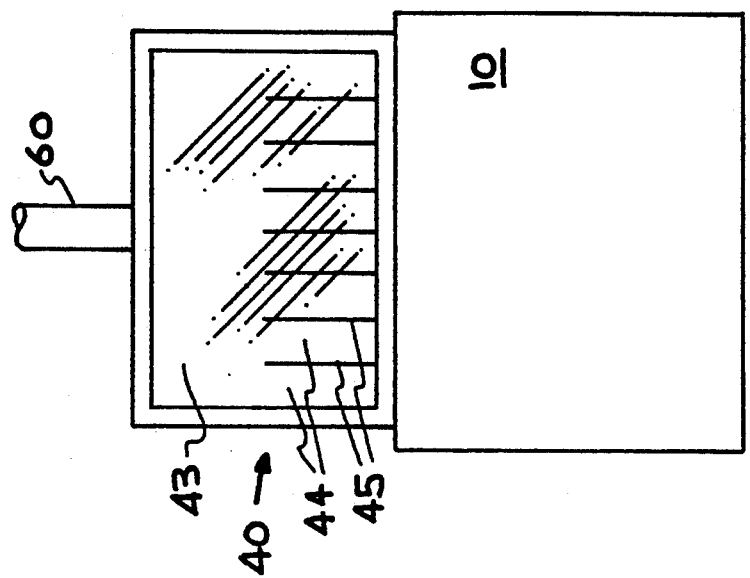
FIG. 3 is a side view of a portion of the apparatus shown in FIG. 2, but with the enclosure of the invention fitted on the top surface of the apparatus over the vacuum deposition chamber in preparation for opening the chamber.

When it is desired to open chamber 11, for example to clean it or to change some of the components so that a different diameter wafer may be processed therein, in accordance with the invention, enclosure 40 is first mounted onto the top surface of apparatus 10, as shown in FIG. 3.

Figure 4:
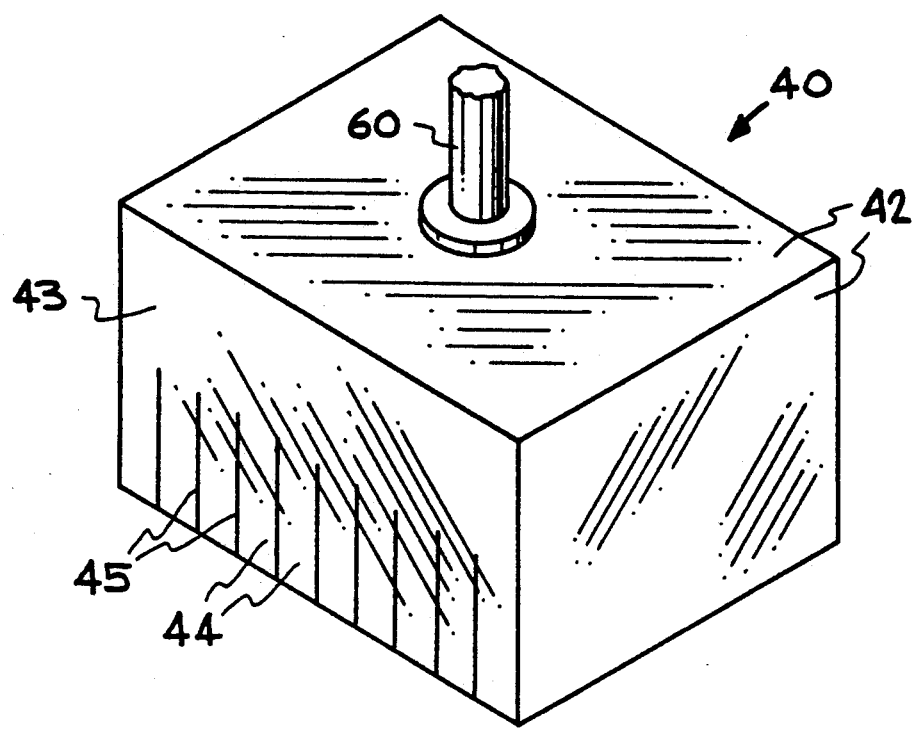
FIG. 4 is an isometric view of the enclosure of the invention used to provide an atmosphere of non-reactive gas over the top portion of the apparatus, showing the means for providing ingress and egress to the interior of the enclosure by a worker without admission of moisture or oxygen-containing gases into the enclosure.
Figure 5:
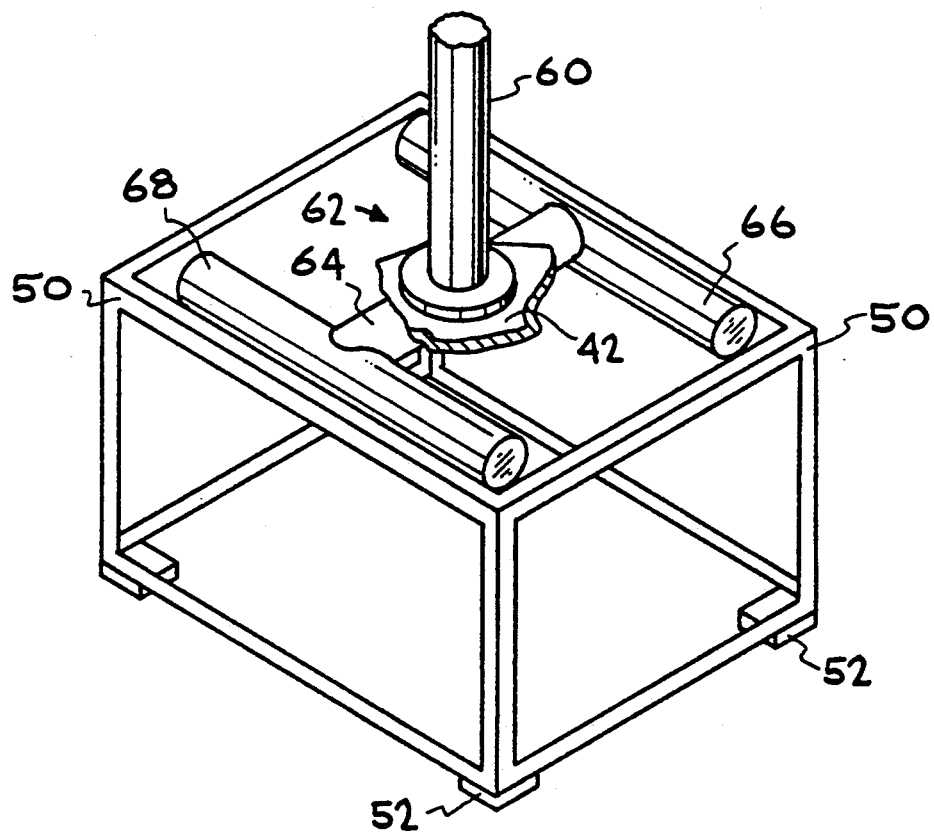
FIG. 5 is an isometric view of the framework of the enclosure, including a portion of the gas distribution manifold used to provide a flow of non-reactive gas into the enclosure.
Figure 6:
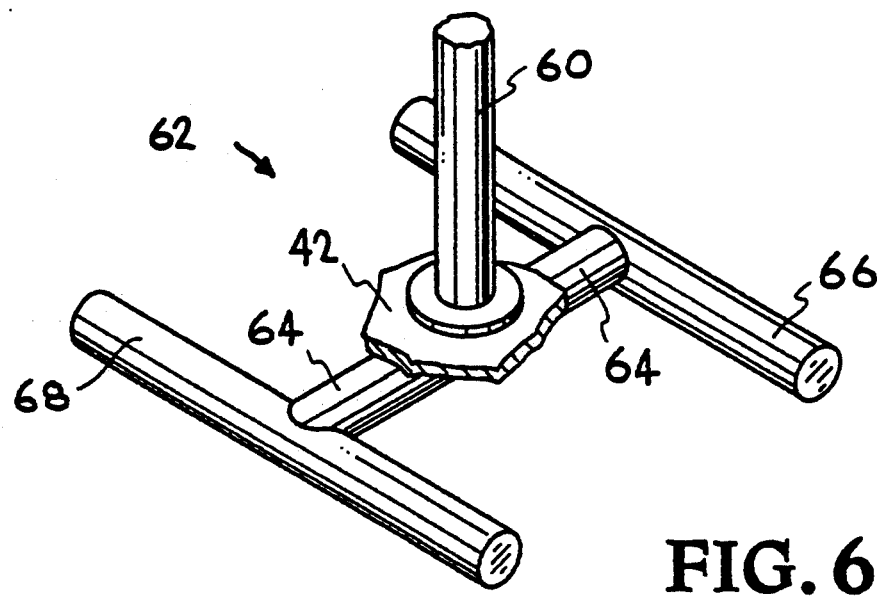
FIG. 6 is a top view of the gas distribution manifold for flowing the non-reactive gas into the enclosure.

As more clearly shown in FIGS. 4 and 5, enclosure 40 comprises a hood-like structure which may, as shown in the illustrations, be generally rectangular in shape with perimeter dimensions generally just slightly smaller than that of vacuum deposition reactor apparatus 10, but slightly larger than the diameter of ring 14, to permit enclosure 40 to rest on the upper surface of apparatus 10 surrounding ring 14, with sufficient room to permit access to and removal of ring 14 with enclosure 40 in place. Enclosure 40 is most preferably formed of transparent sheet material 42, such as a transparent plastic to permit one working within enclosure 40 with his/her hands to visually monitor the work from outside enclosure 40. When enclosure 40 is formed from a transparent flexible plastic material, e.g., a polyethylene or vinyl material, a frame 50, formed of metal or wood, but preferably from a rigid plastic material, is used to provide a rigid support for transparent plastic material 42, as shown in FIG. 5.

Alternatively, if transparent sheet material 42 is formed in part of a rigid transparent material, as will be described below, rigid frame 50 may be either partially or totally eliminated.

Figure 7:
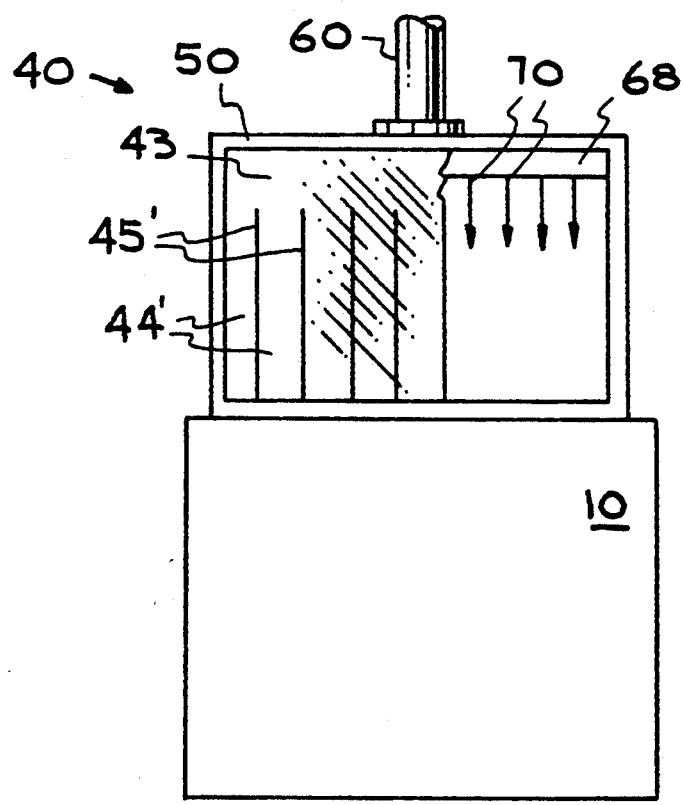
FIG. 7 is a vertical side view of the enclosure mounted on the apparatus over the top of the vacuum deposition chamber with the cover of the enclosure partially removed to show the flow of non-reactive gas flowing downward from the manifold into the enclosure from the top of the enclosure to provide a blanket of non-reactive gas flowing downwardly adjacent the opening into the enclosure to prevent ingress of outside gases into the enclosure.

In any event, as shown in FIG. 3, 4, and 7, at least a portion of transparent sheet material 42 is formed of a flexible plastic material which will permit insertion of one's hands into the enclosure to permit one to access the top of the vacuum deposition apparatus in order to open and service chamber 11.

Such flexible plastic material, which preferably is also transparent, is usually provided on either one side 43 of enclosure 40, or on side 43 as well as the opposite side of enclosure 40 as well. As shown in FIGS. 3 and 4, preferably flexible plastic material 42 is cut at 45 into strips 44, providing a structure similar to that found at entrances to clean rooms in semiconductor wafer processing facilities.

Alternatively, the flexible plastic material could be provided with a single slit on side 43 of enclosure 40, with the two halves of the slit provided with velcro or other fastening means to permit the opening formed by the slit to be wholly or partially closed.

As shown in FIGS. 3 and 4, the cuts 45 in flexible plastic material 42 may extend only about half way up side 43, resulting in short strips 44. Alternatively, as shown in FIG. 7, cuts 45' in flexible plastic material 42 may extend further up side 43 of enclosure 40 resulting in longer individual strips 44'. While the provision of longer length cuts 45' and strips 44', as illustrated in FIG. 7, will facilitate access to the interior of enclosure 40, and to the top of deposition apparatus 10, shorter length strips 44 and cuts 45 will reduce the possibility of undesired gases or solid materials from entering enclosure 40. The use of such short strips 44 and cuts 45, as shown in FIG. 3 and 4, would also permit the use of rigid transparent material on the upper portion of side 43 of enclosure 40, if desired.

Referring to FIGS. 2 and 5, it will be noted that the bottom of frame 50 in FIG. 5 is provided with what appears to be small appendages or members 52, and similar raised portions or members 54 are found on the top surface of apparatus 10. Such members 52 and 54 comprise fastening means capable of interlocking with one another, such as, for example, adhesive or velcro strips, which prevent or inhibit lateral movement of enclosure 40 with respect to vacuum deposition apparatus 10, once enclosure 40 has been placed on the top surface of apparatus 10 in preparation for opening vacuum deposition chamber 11.

In accordance with the invention, to prevent moisture or oxygen-containing gases, such as air, from entering enclosure 40 and subsequently entering vacuum deposition chamber 11 after it is opened, one or more non-reactive gases, such as, for example, neon, argon, helium, or nitrogen, is flowed into enclosure 40 via conduit 60. A sufficient flow of such gas or gases into enclosure 40 is maintained to provide a slight positive pressure inside enclosure 40 to thereby prevent the entrance of undesirable gases and or solid particles into enclosure 40. Usually a flow of from about 20 standard liters per minute (slm) to about 40 slm of said non-reactive gas, per cubic foot of volume of said enclosure will comprise a sufficient flow to prevent entry of either moisture and/or oxygen-containing gases into said enclosure and into the open deposition chamber.

In accordance with a preferred embodiment of the invention, the flow of such non-reactive gas or gases into enclosure 40 is preferably directed downward from the top of enclosure 40 from positions at the top of enclosure 40 adjacent the walls having openings therein, e.g., sidewall 43, so that a downwardly directed gas flow or gas curtain will be provided just inside the openings, e.g., just inside strips 44 or 44' and slits 45 or 45', through the flexible plastic.

To provide such a gas flow, a gas manifold 62 is connected to gas inlet conduit 60, as shown in FIG. 5. Manifold 62, in the illustrated embodiment, comprises a first cross conduit 64 which interconnects gas inlet conduit 60 with gas outlet conduits 66 and 68. Outlet conduits 66 and 68 are positioned at the top of enclosure 40 along the sides of enclosure 40, such as sidewall 43, which have openings therein. In this manner, non-reactive gases entering manifold 62 via conduit 60 flow into enclosure 40 through generally downwardly facing openings 70 in conduits 66 and 68, as best seen in FIG. 7, to provide a downward flowing gas curtain just inside transparent flexible plastic strips 44'.

Thus, in the practice of the invention, enclosure 40 is placed on the top surface of vacuum deposition apparatus 10 (after moving upper heat lamp module 34, if present, out of the way). The flow of non-reactive gas or gases into enclosure 40 is then commenced to purge moisture and/or oxygen-containing gases from enclosure 40. Cover ring 14 and upper quartz window 12 may then be removed, by reaching into enclosure 40 via strips 44 or 44, formed by slits 45 or 45' in flexible plastic material 42, to thereby open vacuum deposition chamber while continuing the flow of one or more non-reactive gases into enclosure 40.

If components are to be removed from chamber 11, such components may be placed in a special sealable container, which might comprise, in a simplified approach, a sealable plastic bag, to be removed from chamber 11, and then from enclosure 40, for transporting to a remote location, e.g., a vented enclosure, where the components may be cleaned or in other ways serviced.

After completion of the work within the vacuum deposition chamber, quartz window 12 and cover ring 14 are resecured to vacuum deposition apparatus 10 to reseal chamber 11. The flow of non-reactive gas/gases into enclosure 40 may then be stopped and enclosure 40 may be removed from apparatus 10.

In this manner chamber may be serviced and components added, replaced, and/or removed from chamber 11 without exposing chlorosilane residues within chamber 11 to moisture and/or oxygen-containing gases capable of reacting with such chlorosilane residues to form corrosive HCl vapors and/or incendiary products within or adjacent to the vacuum deposition apparatus.

Having thus described the invention what is claimed is:

1. A process for providing access to the interior of a vacuum deposition chamber in a vacuum deposition apparatus through a cover on said chamber without exposing residues within said chamber to moisture and/or oxygen-containing gases which comprises:
    a) placing over the upper surface of said vacuum deposition apparatus containing said vacuum deposition chamber an enclosure which has a bottom opening large enough to completely cover said cover on said chamber, and which is capable of being filled with one or more non-reactive gases;
    b) flowing one or more non-reactive gases into said enclosure to purge moisture and/or oxygen-containing gases from said enclosure;
    c) then removing said cover through one or more openings in one or more sidewalls of said enclosure to thereby open said vacuum deposition chamber while continuing to flow said one or more non-reactive gases into said enclosure;
    d) servicing the interior of said vacuum deposition chamber;
    e) closing said vacuum deposition chamber;
    f) then shutting off said flow of non-reactive gases into said enclosure; and
    g) then removing said enclosure from said apparatus.

2. The process of claim 1 including the further step of flowing said one or more non-reactive gases into said enclosure downwardly from the top of the enclosure adjacent said one or more sidewalls having one or more openings therein for accessing said vacuum chamber, to thereby provide a gas curtain of non-reactive gas flow across said one or more openings to inhibit ingress of moisture and/or oxygen-containing gases, as well as particle impurities, into the interior of said vacuum deposition chamber when said cover is removed.

3. The process of claim 1 wherein said step of flowing said one or more non-reactive gases into said enclosure further comprises flowing one or more non-reactive gases selected from the group consisting of neon, argon, helium, nitrogen, and combinations thereof.

4. The process of claim 1 wherein said step of flowing said one or more non-reactive gases into said enclosure further comprises flowing said one or more non-reactive gases into said enclosure at a flow rate of from about 20 slm to about 40 slm per cubic foot of volume of said enclosure.

5. The process of claim 1 including the further steps of placing one or more components within said vacuum deposition chamber having said residues on the surface thereof, into a gas-tight container and removing said container containing said one or more residue-coated components from said chamber and said enclosure, to thereby avoid exposure of said residues on the surfaces of said component to moisture and/or oxygen-containing gases while said component is being removed from said chamber and from said enclosure.

6. The process of claim 1 including the further step of securing a bottom surface of said enclosure to said upper surface of said vacuum deposition apparatus to inhibit said enclosure from moving off said upper surface of said vacuum deposition apparatus while said chamber is being serviced.

7. The process of claim 1 wherein said flow of said one or more non-reactive gases into said enclosure is maintained sufficient to provide a slight positive pressure inside said enclosure.

8. A process which permits the interior of a vacuum chamber to be serviced without exposing the interior of said chamber, including residues therein to be removed, to moisture and/or oxygen-containing gases, using a portable enclosure which may be removably fitted over said vacuum chamber which comprises:
    a) placing over an upper surface of said vacuum chamber, adjacent a cover on said chamber, an enclosure which has a bottom opening large enough to completely cover said cover on said chamber, and which is capable of being filled with one or more non-reactive gases;
    b) flowing one or more non-reactive gases into said enclosure to purge moisture and/or oxygen-containing gases from said enclosure;
    c) then removing said cover from said vacuum chamber through one or more openings in one or more sidewalls of said enclosure to thereby provide access to the interior of said vacuum chamber to permit said interior of said vacuum chamber to be serviced, while continuing to flow said one or more non-reactive gases into said enclosure;
    d) servicing the interior of said vacuum chamber through said one or more openings in said one or more sidewalls of said enclosure;
    e) then closing said vacuum chamber through said one or more openings in said one or more sidewalls of said enclosure;
    f) then shutting off said flow of non-reactive gases into said enclosure; and
    g) then removing said enclosure from said apparatus 9. The process of claim 8 wherein said flow of said one or more non-reactive gases into said enclosure is maintained sufficient to provide a slight positive pressure inside said enclosure.

* * * * *